United States Patent [19]
Haji

[11] Patent Number: 5,972,163
[45] Date of Patent: Oct. 26, 1999

[54] PLASMA CLEANING DEVICE FOR SUBSTRATE

[75] Inventor: Hiroshi Haji, Fukuoka, Japan

[73] Assignee: Matsushita Electric Industrial Co., Ltd., Osaka, Japan

[21] Appl. No.: 09/019,618

[22] Filed: Feb. 6, 1998

[30]     Foreign Application Priority Data

Feb. 10, 1997   [JP]   Japan ................................... 9-026474

[51] Int. Cl.⁶ ................................................... H05H 1/00
[52] U.S. Cl. ........................................................... 156/345
[58] Field of Search ....................... 156/345; 118/723 E; 204/298.34

[56]            References Cited

U.S. PATENT DOCUMENTS 4,891,087   1/1990   Davis et al. ............................. 156/345

*Primary Examiner*—Thi Dang
*Attorney, Agent, or Firm*—Pearne, Gordon, McCoy & Granger LLP

[57]            ABSTRACT

In a plasma cleaning device for a substrate, a vacuum chamber is arranged on a base board and made up of a lid which is opened and closed when necessary, and an electrode to which a high frequency power supply applies high frequency voltage includes an upper electrode, a middle electrode, and a lower electrode. The upper electrode is inside the vacuum chamber, and serves as a means for laying a substrate to be plasma-cleaned. The upper electrode has protrusions for guiding a substrate which is conveyed. In the device, the substrate which has been plasma is slid on the upper electrode while being guided by the protrusions, thus being conveyed to a wire bonding unit. When a kind of substrate is changed to another one, only the upper electrode is replaced with another one which corresponds in size to the new substrate.

4 Claims, 5 Drawing Sheets

PLASMA CLEANING DEVICE FOR SUBSTRATE

BACKGROUND OF THE INVENTION

This invention relates a plasma cleaning device for a substrate board which cleans the surface of a base board with plasma.

A plasma cleaning method is known as a method of cleaning the surface of a substrate (disclosed for instance by the Unexamined Japanese Patent Application Publication No. Hei 6-21032). In the method, the surface treatment of a substrate is performed as follows: A plasma is produced in a pressured reduced atmosphere, and the plasma thus produced is applied to the surface of a substrate to clean it. In the method, it is necessary to provide a vacuum chamber for a pressure-reduced atmosphere, and an electrode to which high frequency voltage is applied to produce a plasma. Hence, it is necessary to open and close the vacuum chamber for every cleaning operation.

In general, downstream of the plasma cleaning device, units such as a wiring bonding unit are provided. In order to improve the production efficiency, it is preferable that the plasma cleaning device is smoothly connected to the units such as a wiring bonding unit which are provided downstream of the plasma cleaning device to arrange the device in line with the units thereby to smoothly convey a substrate to the units downstream of the device. However, with the plasma cleaning device, it is necessary to open and close the vacuum chamber for every cleaning work. On the other hand, different substrates have different widths (being different in size) - if a kind of substrate to be plasma-cleaned is changed with another kind of substrate, then the latter is different in size (width) from the former. Hence, it is rather difficult to arrange the plasma cleaning device in line with the units such as a wiring bonding unit which are arranged downstream of the plasma cleaning device. That is, the process efficiency is low.

SUMMARY OF THE INVENTION

In view of the foregoing, an object of the invention is to provide a plasma cleaning device for a substrate which can be connected to other units such as a wiring bonding unit, and in which whenever a king of a substrate to be cleaned is changed, the set up can be achieved with ease.

The foregoing object and other objects of the invention have been achieved by the provision of a plasma cleaning device for a substrate which comprises:

a vacuum chamber including a base board, and a lid which is provided on the base board and has a recess in the lower surface thereof;

opening and closing means for moving the lid to and from the base board to open and close the vacuum chamber;

gas supplying means for supplying plasma producing gas into the vacuum chamber;

an electrode arranged at the center of the base board;

a grounding section which is provided on the base board in such a manner that the grounding section is located outside of the electrode, and on which the lower surface of the lid is grounded;

a high frequency power supply for applying high frequency voltage to the electrode; and conveying means for conveying the substrate onto the electrode, wherein the electrode includes;

a lower portion connected to the high frequency power supply, and an upper portion which is detachably mounted on the upper end of the lower portion, and has linear guide means in the upper surface thereof which guide the conveyance of the substrate while being in contact with both ends of the substrate, and the conveying means is so designed that, when the lid is spaced from the base board to open the vacuum chamber, the substrate to be plasma-cleaned is conveyed from one side of the guide means onto the electrode, and the substrate which has been plasma-cleaned and is on the electrode is conveyed to the other side of the guide means.

In the plasma cleaning device of the invention, the upper electrode in the vacuum chamber serves as a substrate laying section and substrate conveying guide rails. Hence, the substrate which has been plasma-cleaned inside the vacuum chamber can be conveyed, as it is, to a unit such as a wire bonding unit located downstream of the device while being slid on the upper electrode. In the case where a kind of substrate to be cleaned is changed into another kind of substrate, the setup can be readily and quickly achieved merely by replacing the upper electrode with another one which agrees with the new substrate.

The nature, utility and principle of the invention will be more clearly understood from the following detailed description and the appended claims when read in conjunction with the accompanying drawings.

DETAILED DESCRIPTION OF THE EMBODIMENTS

A plasma cleaning device for a substrate, which constitutes a preferred embodiment of the invention, will be described with reference to the accompanying drawings.

First, the whole arrangement of the plasma cleaning device will be described with reference to FIG. 1.

Figure 1:
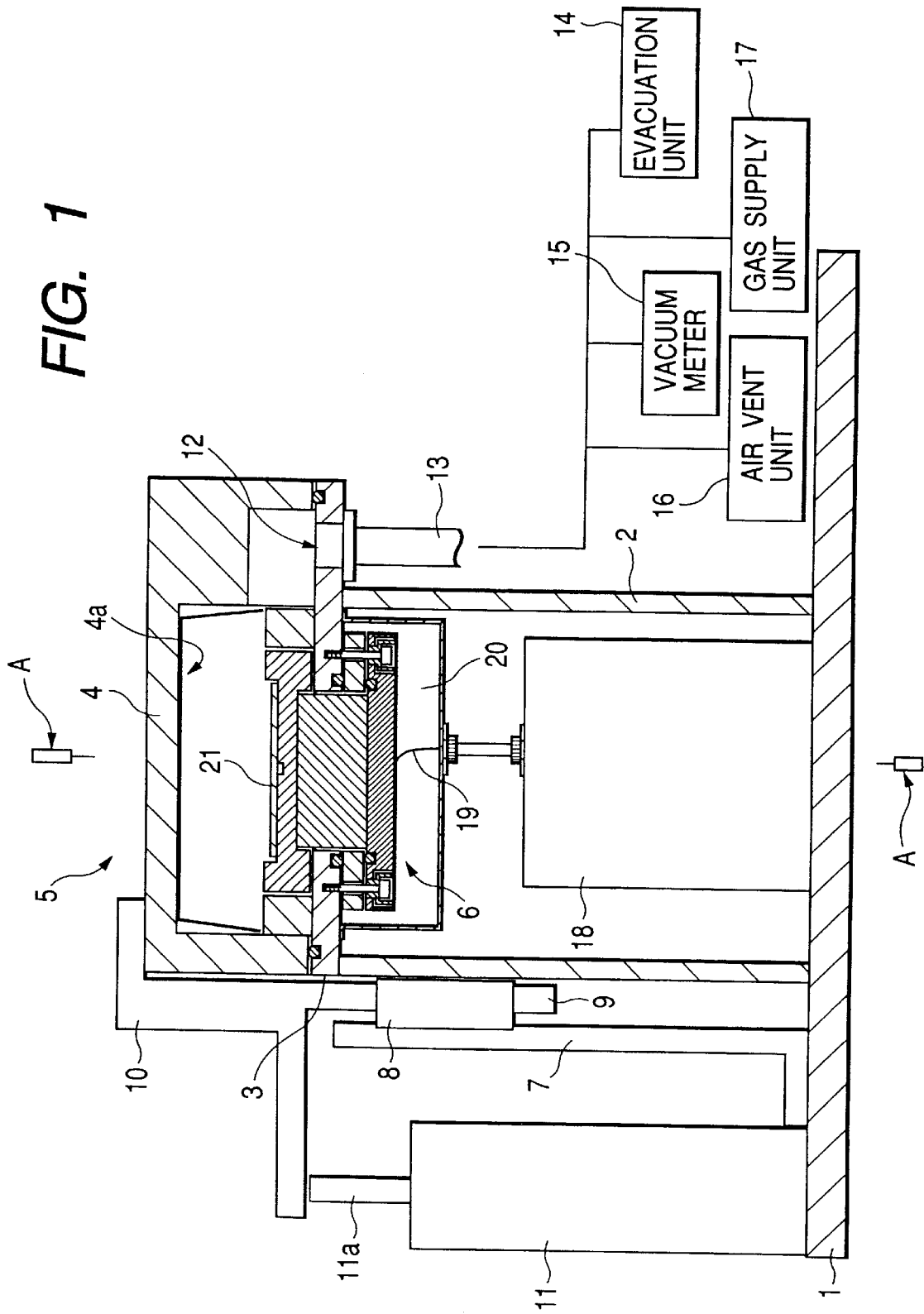
FIG. 1 is a side view of a plasma cleaning device for a substrate, which constitutes a preferred embodiment of the invention.

In FIG. 1, reference numeral 1 designates a base frame, on which various elements are arranged. A casing 2 is mounted on the base frame 1. A base board 3 is provided on the casing 2, and a lid 4 is provided on the base board. The lid has a recess 4a in the lower surface of the lid 4. The base board 3 and the lid 4 form a vacuum chamber 5 (described with reference 2 later). An electrode 6 is combined with the base board 3 in such a manner that the former 6 penetrates the latter 3. A substrate 21 to be plasma-cleaned is supported on the upper surface of the electrode 6. The electrode 6 will be also described with reference 2 in detail.

An L-shaped bracket 7 is provided on one side of the casing 2. A guide 8 is mounted on the bracket 7, and a shaft 9 is inserted into the guide 8 in such a manner that it is vertically slidable. The upper portion of the shaft 9 is coupled to a hook-shaped frame 10. The upper portion of the frame 10 is horizontally extended, and is coupled to the lid 4. On the base frame 1, a cylinder 11 is mounted erect. The lower surface of the frame 10 is in contact with the upper end of the rod 11a of the cylinder 11. Hence, as the rod 11a of the cylinder 11 is pulled out, the lid 4 is raised to open the vacuum chamber 5; and as the rod 11a is pulled in, the lid 4 is lowered to close the vacuum chamber 5. That is, the cylinder 11 is a vacuum chamber (5) opening and closing means.

A through-hole 12 is formed in the right end portion of the base board 3, and is connected to a pipe 13. The latter 13 is connected to an evacuation unit 14, a vacuum meter 15, an air vent unit 16, and a gas supply unit 17. The latter 17 is adapted to supply a plasma producing gas such as argon gas. A high frequency power supply 18 is provided below the electrode 6. The high frequency power supply 18 is electrically connected to the electrode 6 through a cable 19. The high frequency power supply 18 is adapted to apply high frequency voltage to the electrode 6. The electrode 6 and the cable 19 is covered with a shield casing.

Now, the vacuum chamber 5, and the electrode 6 will be described with reference to FIGS. 2 and 3.

Figure 2:
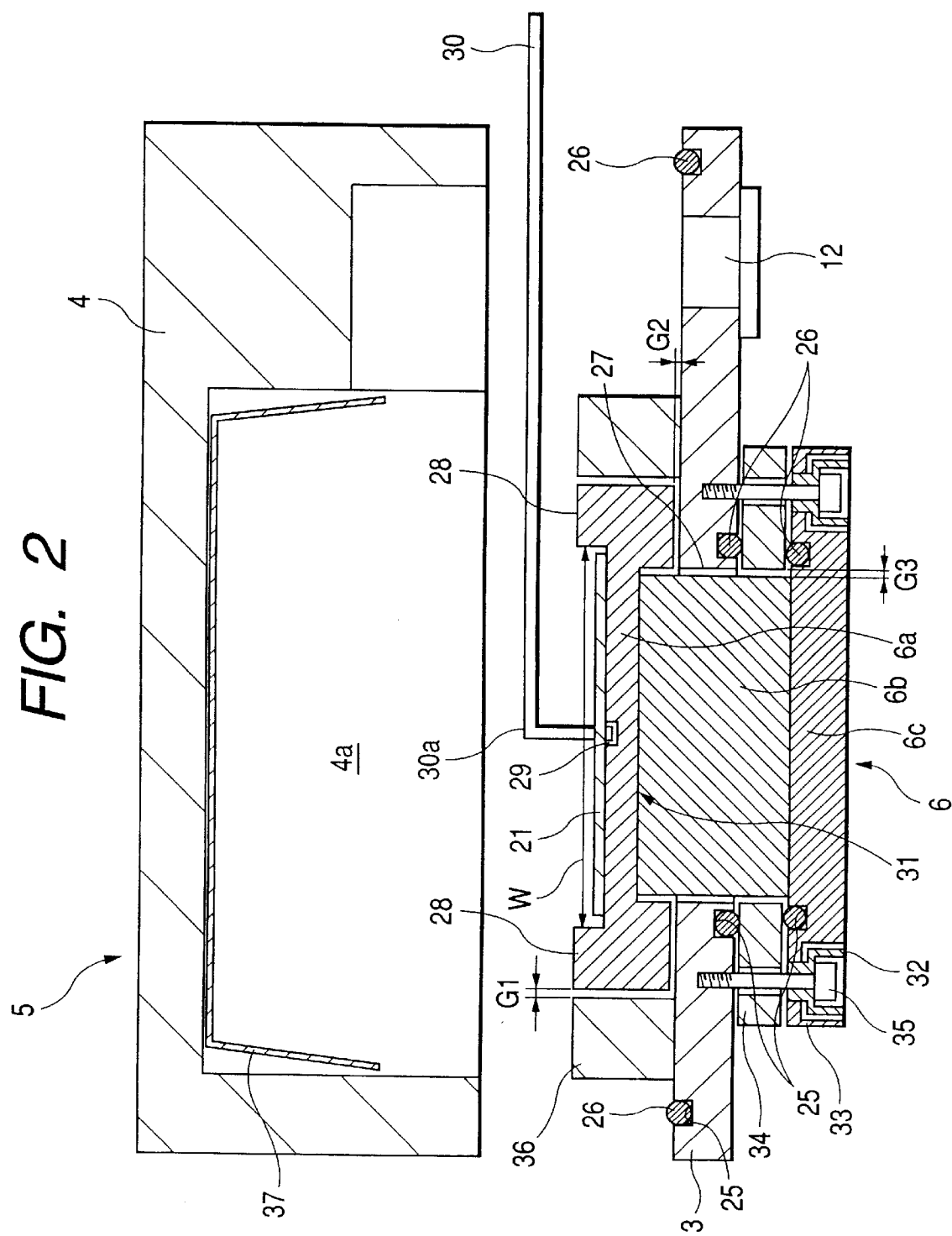
FIGS. 2 through 4 are sectional views showing essential parts of the plasma cleaning device of the invention.
Figure 3:
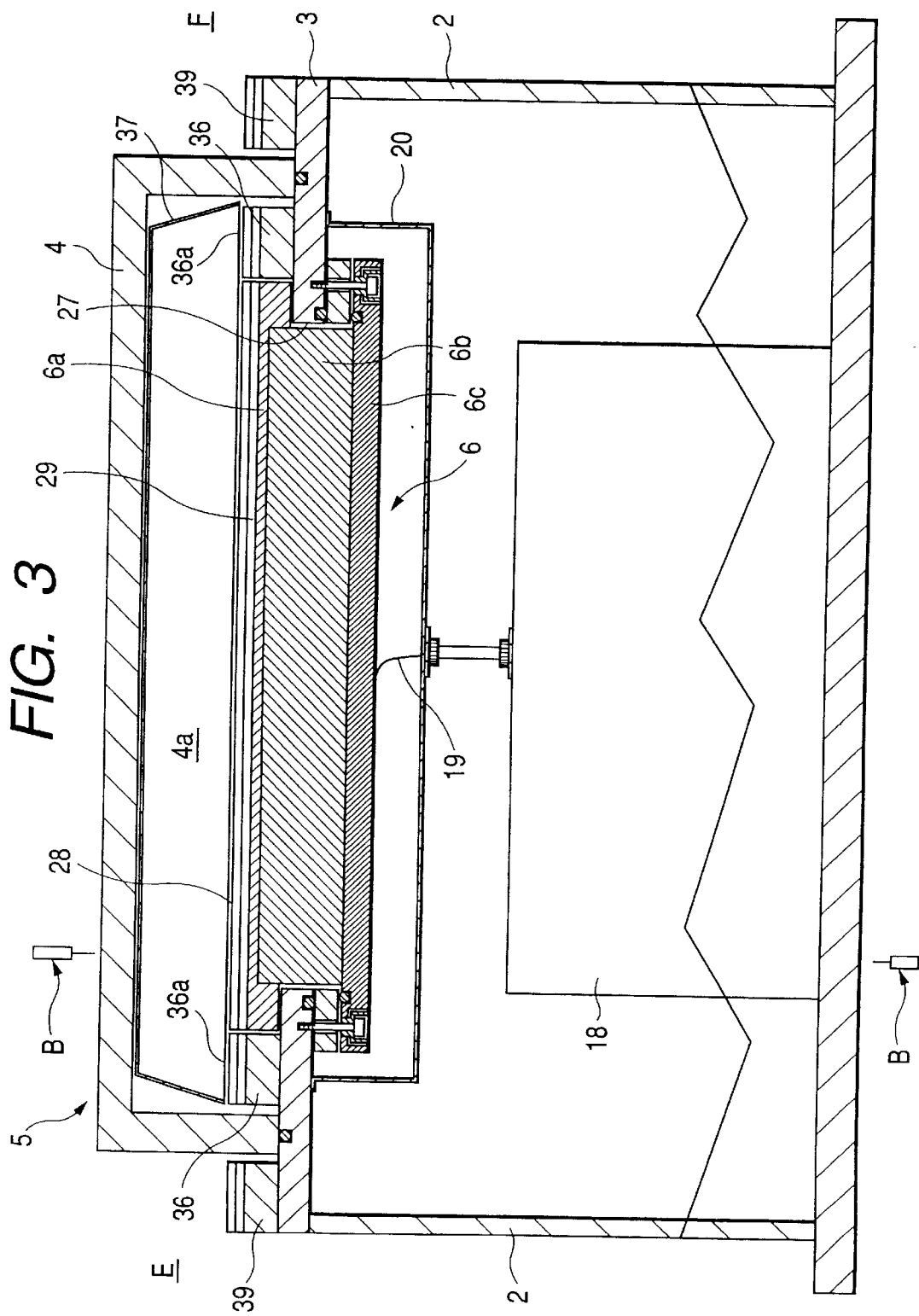

As shown in FIGS. 2 and 3, the vacuum chamber 5 is substantially in the form of a rectangular box. A seal groove 25 is formed in the part of the base board 3 which is in contact with the lid 4. A seal 26 is inserted in the seal groove 25 to seal the vacuum chamber 5.

In the FIGS. 2 and 3, the region which is hatched relatively roughly is the part which serves as a grounding electrode, while the region which is hatched relatively finely is the electrode 6 to which high frequency voltage is applied. First, the electrode 6 will be described. The base board 3 has a rectangular opening 27 in its central portion. The electrode 6 is arranged in such a manner that it is passed through the opening 27. As is seen from FIGS. 2 and 3, the electrode 6 is divided into three parts, namely, an upper electrode 6a, a middle electrode 6b, and a lower electrode 6c. The upper electrode 6a is arranged inside the vacuum chamber 5, and a substrate 21 is laid on the upper surface of the upper electrode 6a. That is, the upper electrode 6a serves additionally as a substrate laying section.

The upper surface of the upper electrode 6a has protrusions 28 at both ends which serve as guides which correspond to the width of a substrate 21. That is, the distance W between the protrusions 28 and 28; in other words, the distance W between the guides is substantially equal to the width of a substrate 21. When a substrate 21 is conveyed, the side surfaces of the protrusions 28 abut against both side surfaces of the substrate 21, to guide the latter 21. Each of the guides is linearly extended from one end of the upper electrode towards the other end. That is, the upper electrode 6a serves as guide rails so that a substrate 21 is conveyed while being slid. The upper surface of the upper electrode 6a has a recess 29 along the central line which is extended in the direction of conveyance of a substrate 21. A pawl 30a at the end of a conveying arm 30 (which is substrate conveying means) is inserted into the aforementioned recess 29.

As shown in FIG. 2, the lower surface of the upper electrode 6a has a recess 31 between both end portions in which the block-shaped middle electrode 6b is fitted. More specifically, the middle electrode 6b is detachably engaged with the recesses 31 with fixing means such as bolts. In other words, the upper electrode 6a is detachably mounted on the middle electrode 6b. The latter 6b is mounted on the lower electrode 6c, and the former 6b is secured to the latter 6c with fixing means such as bolts. The lower electrode 6c has counter-bores 32 for bolts. The counter-bores 32 have insulating washers 33 inside thereof. An insulator 34 is set between the lower electrode 6c and the lower surface of the base board 3. The bolts 35 inserted into the counter-bores 32 are screwed into the lower surface of the base board 3. That is, the lower electrode 6c is fixedly mounted on the lower surface of the base board 3 through the insulator 34 with the bolts 35.

In the lower surface of the base board 3, and in the upper surface of the lower electrode 6c, seal grooves 25 are formed in such a manner as to surround open grooves 27. Seals 26 are fitted in those seal grooves. The inside of the vacuum chamber 5 being evacuated, the lower electrode 6c is strongly pressed through the insulator 34 against the lower surface of the base board 3 because of the air pressure difference. The force of press pushes the seals 26, so that the sealing surface is completed. Since the electrode 6 is divided into three parts as was described above, when a kind of substrate 21 handled is changed to another kind of substrate 21, the upper electrode 6a (mounted) is removed, and an upper electrode 6a having guides the distance W between which agrees with the width of the new substrate 21 is mounted on the middle electrode 6b.

Figure 5:
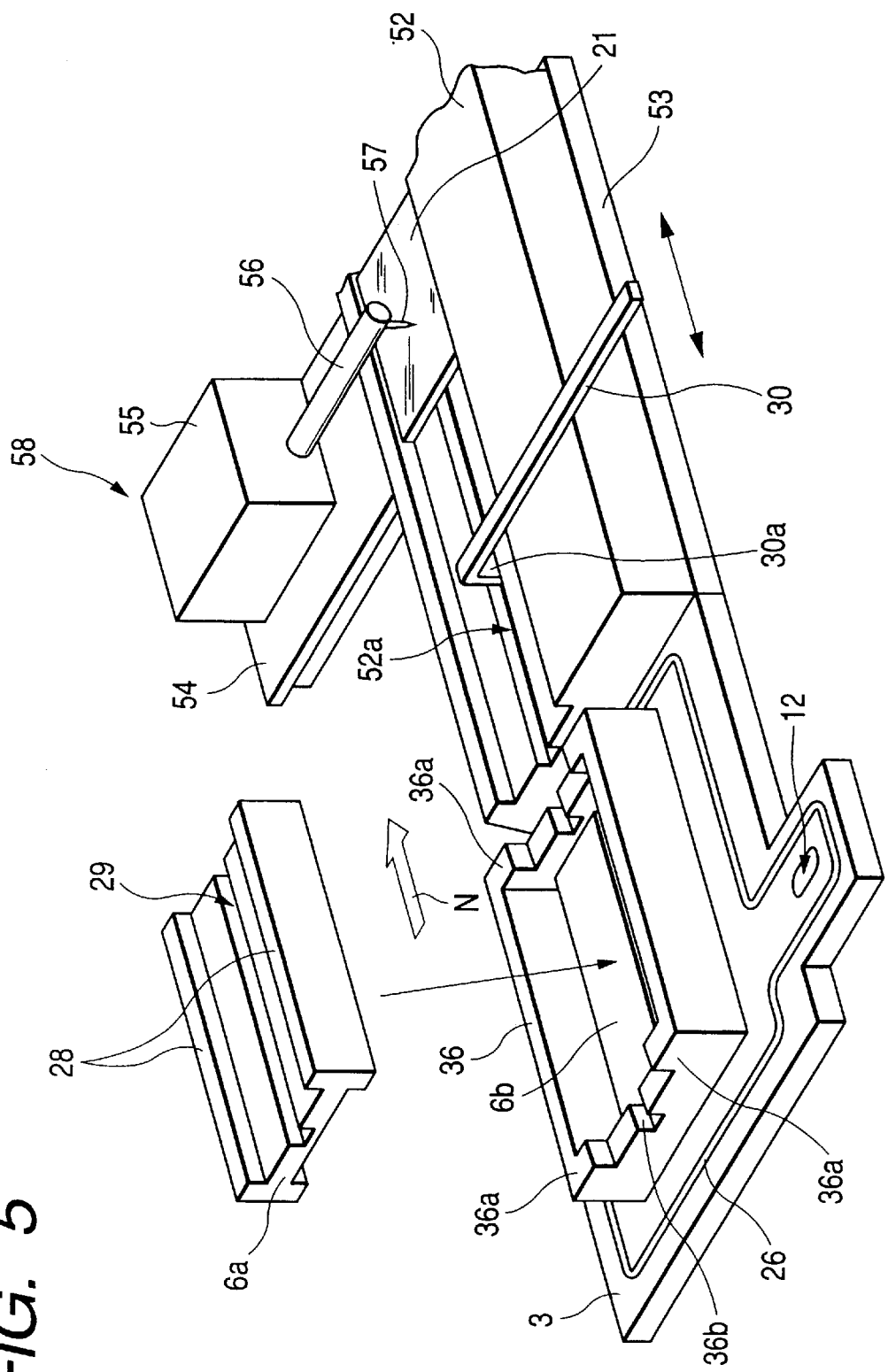
FIG. 5 is a perspective view of the plasma cleaning device of the invention and a wire bonding unit.

Now, the grounding electrode will be described. The grounding electrode includes the base board 3, the lid 4, and an earth (ground) rail which are shown hatched relatively roughly in FIG. 2. The earth rail 36 is provided in such a manner as to surround the upper electrode 6a (cf. FIG. 5, too). As shown in FIGS. 3 and 5, both side walls of each of the front and rear end portions (as viewed in the longitudinal direction or in the direction of conveyance of a substrate 21) of the earth rail 36 has protrusions 36a to guide a substrate 21). The protrusions 36a are in alignment with the above-described protrusions 28. Both side walls of the earth rail have recesses 36b (cf. FIG. 5) in which the pawl 30a of the conveying arm 30 is inserted. The recesses 36b are in alignment with the above-described recess 29.

As shown in FIG. 3, on the base board 3, and outside the vacuum chamber, auxiliary rails 39 which are equal in sectional configuration to the earth rail 36 are provided on the prolongation of the earth rail 36. When the vacuum chamber 5 is open, a substrate is conveyed on the auxiliary rails 39. Similarly as in the case of the upper electrode 6a, when a kind of substrate 21 is changed into another kind of substrate 21, the auxiliary rails are changed into ones which agree with the width of the new substrate 21.

As shown in FIG. 2, the parts of the grounding electrode are confronted with the electrode 6 through insulating gaps G1, G2 and G3, respectively, to the extent that no plasma is produced in those insulating gaps. A replaceable shield 37 is mounted on the inner lower surface of the lid 4; that is, on the surface of the ceiling of the inside of the vacuum chamber 5. During plasma-cleaning, the shield 37 prevents matters removed from a substrate 21 from sticking directly onto the inner lower surface of the lid 4 which is the grounding electrode.

Next, the conveyance system of the plasma cleaning device will be described with reference to FIGS. 4 and 5.

Figure 4:
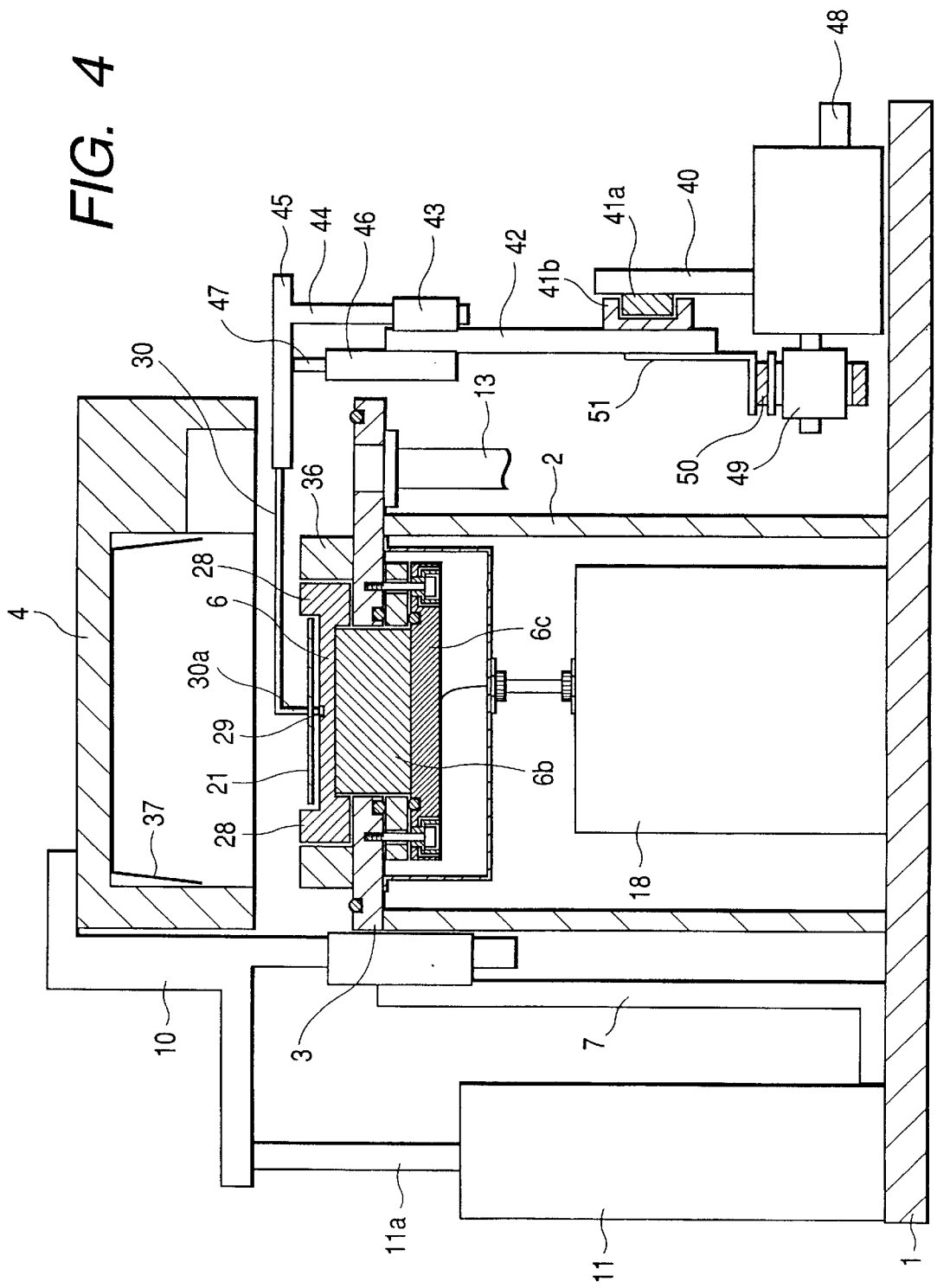

As shown in FIG. 4, an L-shaped bracket 40 is mounted on the base frame 1. A guide rail 41a is mounted on the upper portion of the bracket 40 in such a manner that it is extended horizontally, and a slider 41b is slidably engaged with the guide rail 41a. A supporting plate 42 is extended vertically from the slider 41b. The upper portion of the supporting plate 41 is coupled to a guide 43. A slide shaft 44 is vertically movably inserted into the guide 43. The upper end portion of the slide shaft 44 is coupled to a lift block 45.

A cylinder 46 is mounted on the upper end portion of the supporting plate 42. The end of the rod 47 of the cylinder 46 is coupled to the arm 45. The conveying arm 30 is secured to the end of the lift block 45. The pawl 30a at the end of the conveying arm 30 is bent downwardly, and inserted into the recess 29 of the upper electrode 6a and into the recesses 36b of the earth rail 36 (cf. FIG. 2, too). Hence, when the rod 47 comes in and out of the cylinder 46, the pawl 30a of the conveying arm 30 is moved up and down at the position of the recess 29 of the upper electrode 6a. More specifically, when the rod 47 comes in the cylinder, the pawl 30a is inserted into the recess 29, to push the end of the substrate 21; and when the rod 47 comes out of the cylinder, the pawl 30a retracts above the substrate 21.

As shown in FIG. 4, an electric motor 48 is mounted on the base frame 1. A pulley 49 is fixedly mounted on the rotary shaft of the motor 48. An endless belt 50 is laid over the pulley 49 and a driven pulley (not shown). A bracket 51 is mounted on the belt 50. The upper end portion of the bracket 51 is coupled to the supporting plate 42. Hence, the motor turns forwardly and reversely, the supporting plate 42 is horizontally moved along the guide rail 41a, so that the convey arm 30 conveys the substrate 21 along the upper surface of the upper electrode 6a, and returns to the original position. This operation is repeatedly carried out.

FIG. 5 shows the plasma cleaning device which is in line, and is coupled to a wire bonding unit 58 which is located downstream of the line. The arrow N indicates the direction of conveyance of a substrate which is conveyed by the conveying arm 30. Reference numeral 52 designates a conveying rail of the wire bonding unit 58, which is replaceably mounted on a base member 53. Beside the conveying rail 52, provided is a movable table 54. A wire bonding head 55 is mounted on the movable table 54. FIG. 5 shows the fact that a capillary 57 at the end of an ultrasonic horn 56 of the wire bonding head 55 performs a wire bonding operation for a substrate 21.

The upper surfaces of the upper electrode 6a and of the earth rail 36 function as a conveying surface to slide and convey the substrate 21, and are flush with the conveying rail 51 of the wire bonding unit 58. That is, a workpiece, namely, a substrate 21 is conveyed, as it is, from the plasma cleaning device to the conveying rail 51 of the wire bonding unit 58 for after treatment.

The plasma cleaning device of the invention is constructed as described above. Now, the operation of the device will be described.

First, as shown in FIG. 4, the rod 11a of the cylinder 11 is held pulled out of the latter 11, and the lid 4 of the vacuum chamber 5 is held lifted. Under this condition, the conveying arm 30 pushes and conveys the substrate 21 from the conveying rail (not shown in FIG. 3) on the upstream side (the "E" side of FIG. 3) to a predetermined position on the upper electrode 6a. Thereafter, the conveying arm 30 is moved upwardly and moved horizontally to return to the original position so that it may not obstruct the downward movement of the lid 4. Next, the rod 11a of the cylinder 11 retracts, so that the lid 4 of the vacuum chamber 5 is moved downwardly. When the lid 4 abuts against the base board 3; that is, when the vacuum chamber 5 is closed, the evacuation unit 14 (FIG. 1) is driven.

When the degree of vacuum in the vacuum chamber 5 has reached a predetermined value, the gas supply unit (FIG. 1) 17 is driven, to introduce a plasma producing gas into the vacuum chamber 5. Next, the high frequency power supply 18 (FIG. 1) is driven to apply high frequency voltage to the electrode 6. Owing to the high frequency voltage, the plasma producing gas becomes a plasma gas, so that the ionized plasma producing gas and electrons collide with the surface of the substrate 21. As a result, dirt and oxide films are removed from the surface of the substrate 21. After the plasma cleaning operation, the air vent unit 16 (FIG. 1) is activated to introduce the air into the vacuum chamber 5. Thereafter, the lid of the vacuum chamber 5 is moved upwardly to open the latter 5.

Next, the conveying arm 30 is raised, and then moved to the rear end of the substrate 21 which has been plasma-cleaned. Under this condition, the pawl 30a of the conveying arm 30 is moved downwardly until it is inserted into the recess 29 of the upper electrode 6a. Thereafter, the conveying arm 30 is moved horizontally while conveying the substrate 21, so that the latter 21 thus conveyed is laid, as it is, onto the conveying rail 52 (FIG. 5) of the wire bonding device which is arranged on the downstream side (the "F" side in FIG. 3). Thereafter, the conveying arm 30 is returned to the original position. Thus, one cycle of plasma cleaning has been accomplished.

In the plasma cleaning device of the invention, the upper electrode in the vacuum chamber serves as a substrate laying section and a substrate conveying guide rails. Therefore, the substrate which has been plasma-cleaned in the vacuum chamber is slid on the upper electrode and conveyed, as it is, towards other units such as a wire bonding unit with ease. Hence, the plasma cleaning device can be readily connected to and arranged in line with a unit such as a wire bonding unit downstream thereof. In the case where a substrate to be plasma-cleaned is changed in size (width), only the upper electrode is changed to one which agrees with a new substrate. Hence, in such a case, the setup can be achieved readily and quickly.

While there has been described in connection with the preferred embodiment of the invention, it will be obvious to those skilled in the art that various changes and modifications may be made therein without departing from the invention, and it is aimed, therefore, to cover in the appended claim all such changes and modifications as fall within the true spirit and scope of the invention.

What is claimed is:

1. A plasma cleaning device for a substrate comprising:
    a vacuum chamber including a base board, and a lid arranged on said base board,
    opening and closing means for opening and closing said lid of said vacuum chamber;
    gas supplying means for supplying plasma producing gas into said vacuum chamber;
    an electrode arranged in such a manner that said electrode penetrates said base board; and
    a high frequency power supply for applying high frequency voltage to said electrode,
    wherein said electrode including
        a lower electrode, and
        an upper electrode which is detachably mounted on said lower electrode and is arranged inside said vacuum chamber so as to be function as a substrate laying section, said upper electrode having guides which abut against both ends of said substrate to guide the conveyance of said substrate,
    so that said substrate is conveyed by substrate conveying means, as it is, from said upper electrode to a unit provided downstream thereof.

2. A plasma cleaning device for a substrate comprising:
    a vacuum chamber including a base board, and a lid which is provided on said base board and has a recess in the lower surface thereof;

opening and closing means for moving said lid to and from said base board to open and close said vacuum chamber;

gas supplying means for supplying plasma producing gas into said vacuum chamber;

an electrode arranged at the center of said base board;

a grounding section which is provided on said base board in such a manner that said grounding section is located outside of said electrode, and on which said lower surface of said lid is grounded;

a high frequency power supply for applying high frequency voltage to said electrode; and conveying means for conveying said substrate onto said electrode, wherein said electrode includes;

a lower portion connected to said high frequency power supply, and an upper portion which is detachably mounted on the upper end of said lower portion, and has linear guide means in the upper surface thereof which guide the conveyance of said substrate while being in contact with both ends of said substrate, and said conveying means is so designed that, when said lid is spaced from said base board to open said vacuum chamber, said substrate to be plasma-cleaned is conveyed from one side of said guide means onto said electrode, and said substrate which has been plasma-cleaned and is on said electrode is conveyed to the other side of said guide means.

3. A plasma cleaning device for a substrate comprising:

a vacuum chamber including a base board, and a lid which is provided on said base board has a recess in the lower surface thereof;

opening and closing means for moving said lid to and from said base board to open and close said vacuum chamber;

gas supplying means for supplying plasma producing gas into said vacuum chamber;

an electrode arranged at the center of said base board;

a high frequency power supply for applying high frequency voltage to said electrode; and an upper electrode which is detachably set on said electrode, and corresponds in size to a substrate to be plasma cleaned.

4. A plasma cleaning device for a substrate comprising:

a vacuum chamber including a base board, and a lid which is provided on said base board has a recess in the lower surface thereof;

opening and closing means for moving said lid to and from said base board to open and close said vacuum chamber;

gas supplying means for supplying plasma producing gas into said vacuum chamber;

an electrode arranged at the center of said base board;

a high frequency power supply for applying high frequency voltage to said electrode;

an upper electrode which is detachably set on said electrode, and has guides whose width is perpendicular to the direction of conveyance of said substrate; and conveying means for conveying said substrate onto said upper electrode under the condition that said lid has been raised by said opening and closing means.

* * * * *